(12) United States Patent
Lian et al.

(10) Patent No.: US 8,109,323 B2
(45) Date of Patent: Feb. 7, 2012

(54) HEAT DISSIPATION DEVICE HAVING A CLIP

(75) Inventors: Zhi-Sheng Lian, Shenzhen (CN);
Gen-Ping Deng, Shenzhen (CN);
Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 507 days.

(21) Appl. No.: 12/409,502

(22) Filed: Mar. 24, 2009

(65) Prior Publication Data
US 2010/0000716 A1 Jan. 7, 2010

(30) Foreign Application Priority Data
Jul. 4, 2008 (CN) .......................... 2008 1 0068323

(51) Int. Cl.
*F28F 7/00* (2006.01)
*H05K 7/20* (2006.01)
*F28D 15/00* (2006.01)

(52) U.S. Cl. .................. 165/80.3; 165/104.33; 361/700; 361/704

(58) Field of Classification Search .................. 165/80.3, 165/104.33; 361/700, 704
See application file for complete search history.

(56) References Cited

U.S. PATENT DOCUMENTS

| | | | | |
|---|---|---|---|---|
| 1,896,501 A * | 2/1933 | Whitaker | | 164/105 |
| 4,777,560 A * | 10/1988 | Herrell et al. | | 361/694 |
| 5,020,586 A * | 6/1991 | Mansingh | | 165/80.3 |
| 5,947,192 A * | 9/1999 | Kuo | | 165/80.3 |
| 6,076,594 A * | 6/2000 | Kuo | | 165/80.3 |
| 6,199,627 B1 * | 3/2001 | Wang | | 165/185 |
| 6,289,975 B2 * | 9/2001 | Kuo | | 165/80.3 |
| 6,491,091 B1 * | 12/2002 | Lin et al. | | 165/80.3 |
| 6,684,476 B1 * | 2/2004 | Yu | | 29/428 |
| 6,883,592 B2 * | 4/2005 | Lee | | 165/80.3 |
| 7,128,131 B2 * | 10/2006 | Kubo | | 165/80.3 |
| 7,350,561 B2 * | 4/2008 | Deng et al. | | 165/80.3 |
| 7,447,035 B2 * | 11/2008 | Liu et al. | | 361/719 |
| 7,613,004 B2 * | 11/2009 | Sasaki | | 361/710 |
| 7,905,274 B2 * | 3/2011 | Kuo | | 165/80.3 |
| 7,916,469 B2 * | 3/2011 | Zhou et al. | | 361/679.47 |
| 2001/0010264 A1 * | 8/2001 | Kuo | | 165/185 |
| 2002/0043360 A1 * | 4/2002 | Lee | | 165/80.3 |
| 2004/0182552 A1 * | 9/2004 | Kubo | | 165/104.33 |
| 2007/0181287 A1 * | 8/2007 | Peng et al. | | 165/80.3 |
| 2007/0215320 A1 * | 9/2007 | Deng et al. | | 165/80.3 |

(Continued)

FOREIGN PATENT DOCUMENTS
CN 101115366 A 1/2008

*Primary Examiner* — Cheryl J Tyler
*Assistant Examiner* — Brandon M Rosati
(74) *Attorney, Agent, or Firm* — Altis Law Group, Inc.

(57) ABSTRACT

A heat dissipation device removing heat from a heat generating electronic device on a printed circuit board includes a base, a plurality of fins attached to the base and a clip for mounting the base and the fins onto the heat generating electronic device. Each of the fins defines a closed through hole therein. The holes of the fins cooperatively define a channel. The clip includes a locking beam extending through the channel of the fins and two fasteners engaging the locking beam mounting the base and the fins onto the heat generating electronic device.

8 Claims, 4 Drawing Sheets

U.S. PATENT DOCUMENTS

| | | | |
|---|---|---|---|
| 2007/0284084 A1* | 12/2007 | Lin | 165/80.3 |
| 2008/0128118 A1* | 6/2008 | Chen et al. | 165/104.33 |
| 2008/0130239 A1* | 6/2008 | Liu et al. | 361/719 |
| 2008/0156460 A1* | 7/2008 | Hwang et al. | 165/80.3 |
| 2009/0050293 A1* | 2/2009 | Kuo | 165/80.3 |
| 2010/0236755 A1* | 9/2010 | Li et al. | 165/80.3 |

* cited by examiner

HEAT DISSIPATION DEVICE HAVING A CLIP

BACKGROUND OF THE DISCLOSURE

1. Field of the Disclosure

The present disclosure generally relates to heat dissipation and, more particularly, to a heat dissipation device mounted on an electronic component, such as an integrated circuit package, using a clip.

2. Description of Related Art

It is well known that electronic packages such as central processing units (CPUs) generate large amounts of heat during normal operations. The generated heat must be adequately dissipated from the electronic packages to maintain an acceptable temperature range. Cooling of a CPU is generally achieved by thermally attaching a heat sink to the CPU whereby heat generated by the CPU is dissipated. Often, the heat sink is held in thermal contact with the CPU by a clip.

A related clip comprises a main body soldered to a bottom of the heat sink and two ends defining mounting holes. A plurality of fasteners extend through the mounting holes of the clip to engage a retainer to fasten the heat dissipation device onto the CPU of a printed circuit board. However, in assembly or manufacture of the heat dissipation device, errors frequently occur during soldering of the fasteners to the bottom of the heat sink. In addition, both the solder used and the process thereof increase manufacturing costs of the heat dissipation device and are environmentally unfriendly.

Therefore, a clip engaging a heat dissipation device which can overcome the limitations described is desired.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE DISCLOSURE

Figure 1:
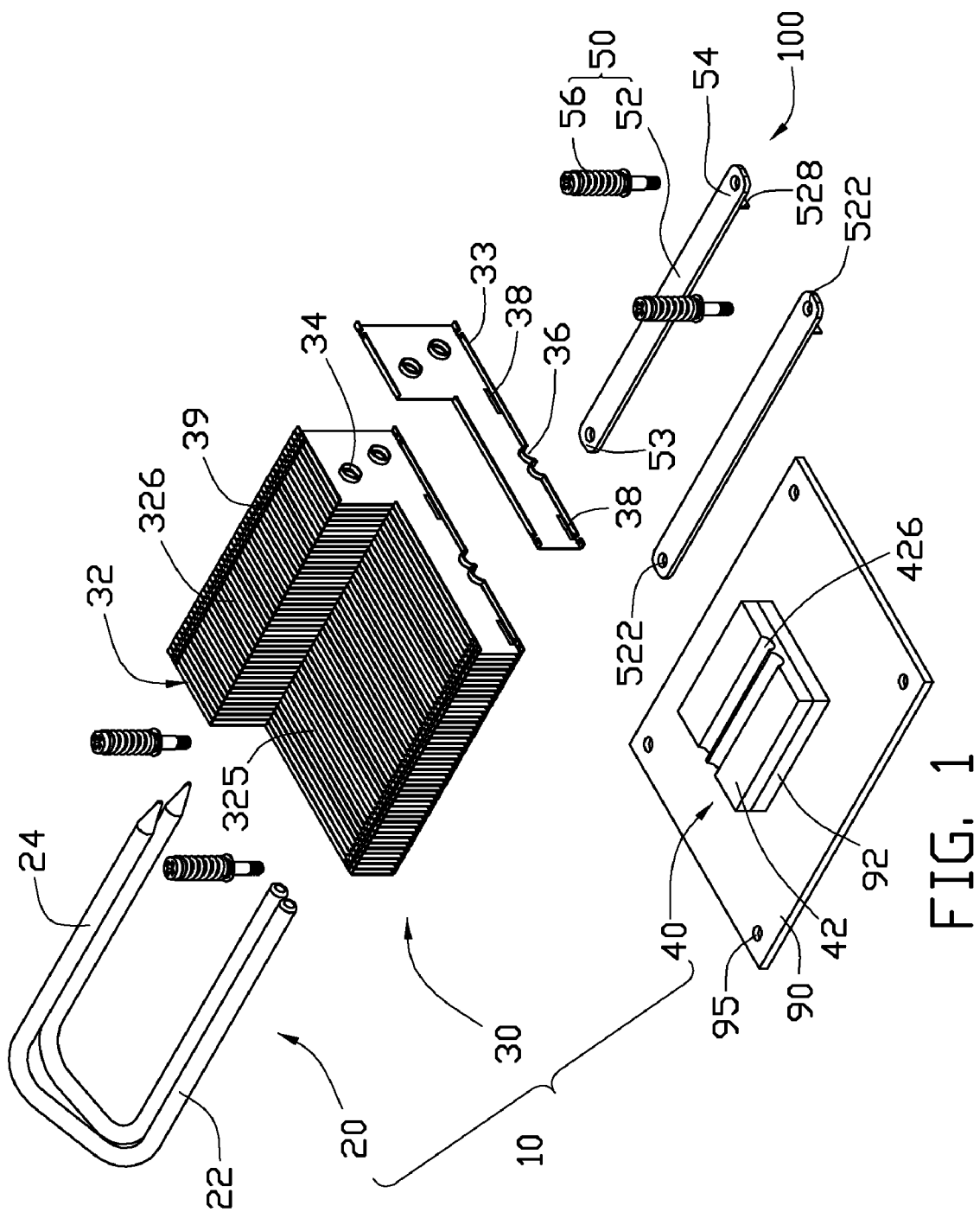
FIG. 1 is an exploded, isometric view of a heat dissipation device in accordance with an embodiment of the present disclosure, together with an electronic component mounted on a printed circuited board.

Referring to FIG. 1, a heat dissipation device of an embodiment of the present disclosure is mounted to a printed circuit board 90 to remove heat from a heat-generating electronic device mounted on the printed circuit board 90, such as a CPU 92. The heat dissipation device comprises a heat sink assembly 10 and a clip 100 including two locking members 50 engaging the heat sink assembly 10 to secure the heat dissipation device to the printed circuit board 90. The heat sink assembly 10 comprises a base 40, a fin set 30 thermally attached to the base 40 and two heat pipes 20 thermally connecting the base 40 and the fin set 30.

The base 40 is a metal plate having high heat conductivity, and has a rectangular configuration. The base 40 comprises a bottom surface (not labeled) contacting the CPU 92 and a top surface 42 opposite to the bottom surface thereof. The base 40 defines two parallel straight grooves 426 in a top portion thereof, receiving the heat pipes 20 therein. The grooves 426 are located at a center of the base 40.

The heat pipes 20 are U-shaped. Each heat pipe 20 comprises a horizontal evaporating portion 22 and a condensing portion 24 parallel thereto. The evaporating portions 22 of the heat pipes 20 are received in the grooves 426 of the base 40.

The fin set 30 comprises a plurality of fins 32. Each fin 32 is a metal sheet in a reclining L-shaped configuration. The fins 32 are oriented perpendicular to the base 40 and parallel. The fin set 30 comprises a first portion 325 and a second portion 326 extending from one short side thereof, with the second portion 326 higher than the first portion 325. The first portion 325 and the second portion 326 respectively form clasps 39 at the top and bottom thereof. The fins 32 connect with each other via the clasps 39 on the top and bottom thereof. The second portion 326 of the fin set 30 is separated from the base 40. The second portion 326 of the fin set 30 defines a pair of spaced first through holes 34 transversely extending across all of the fins 32. The first portion 325 defines two adjoining slots 36 at a bottom thereof. The slots 36 cooperate with the grooves 426 to define channels (not labeled) receiving the evaporating portions 22 of the heat pipes 20 therein, when the fins 32 are arranged together and mounted onto the base 40. Each fin 32 forms two flanges 33 perpendicularly extending from a top edge and a bottom edge thereof. The flanges 33 separate the fins 32 by uniform intervals. Each of the fins 32 of the first portion 325 defines a pair of rectangular second through holes 38. Each pair of second through holes 38 is adjacent and parallel to the bottom and at two opposite ends of the first portion 325 of the fin set 30. Each of the second through holes 38 is a small distance from a bottom surface or the flange 33 of each fin 32. The second through holes 38 of the fins 32 cooperatively define two channels receiving locking beams 52 of the locking members 50.

Each of the locking members 50 comprises the locking beam 52 extending through the fins 32 and two fasteners 56 engaging the locking beam 52. Each of the locking beams 52 includes a position end 54 and a free end 53 opposite thereto. Each locking member 50 defines two mounting holes 522 at the position end 54 and the free end 53 respectively. The fasteners 56 extend through the mounting holes 522 of the locking beams 52 to engage a retainer (not shown) below the printed circuit board 90 for mounting the heat sink assembly 10 onto the CPU 92. A protrusion 528 extends downwardly from the position end 54 of each locking beam 52.

Figure 2:
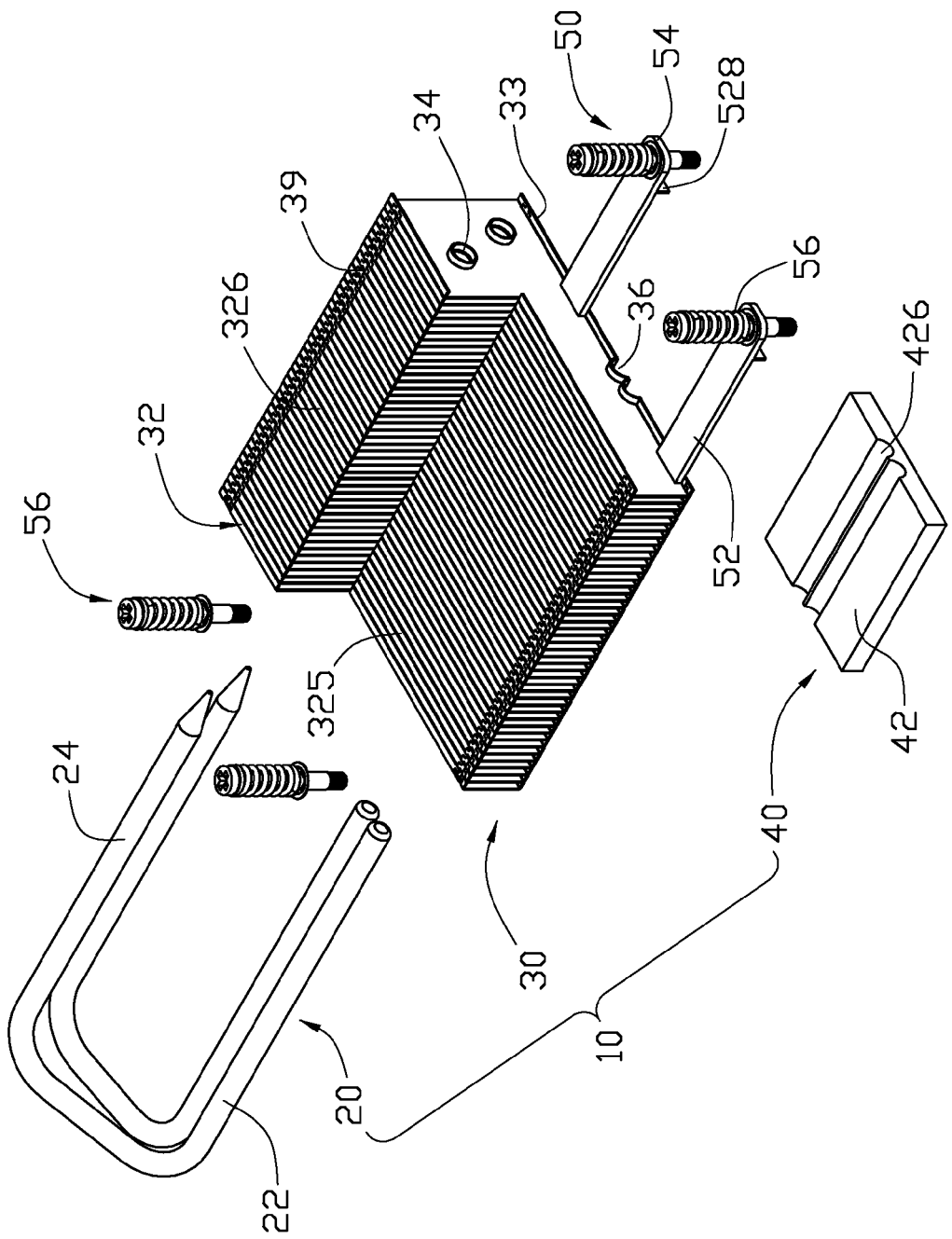
FIG. 2 is a partially assembled, isometric view of the heat dissipation device of FIG. 1.
Figure 3:
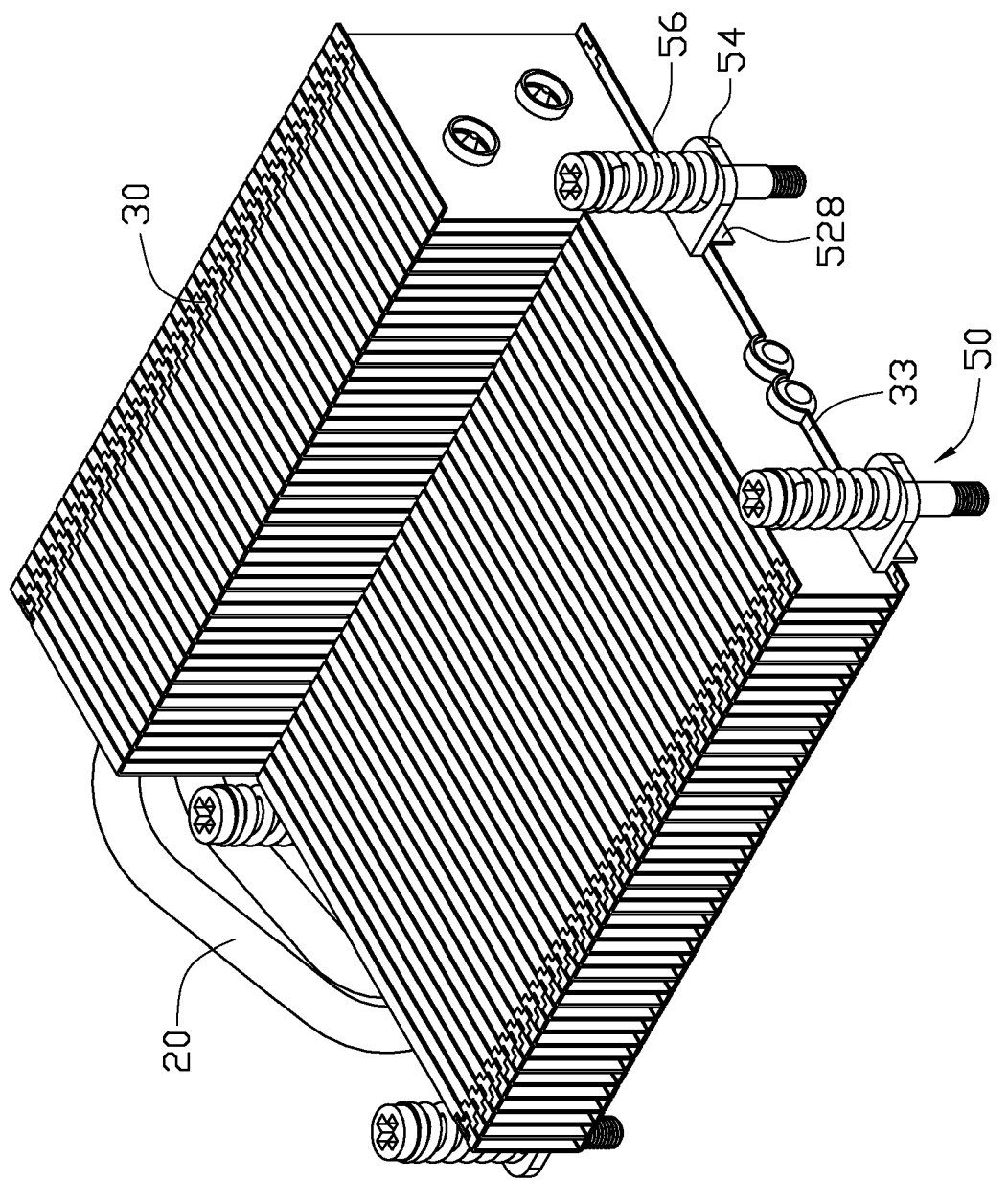
FIG. 3 is an assembled view of the heat dissipation device of FIG. 1.
Figure 4:
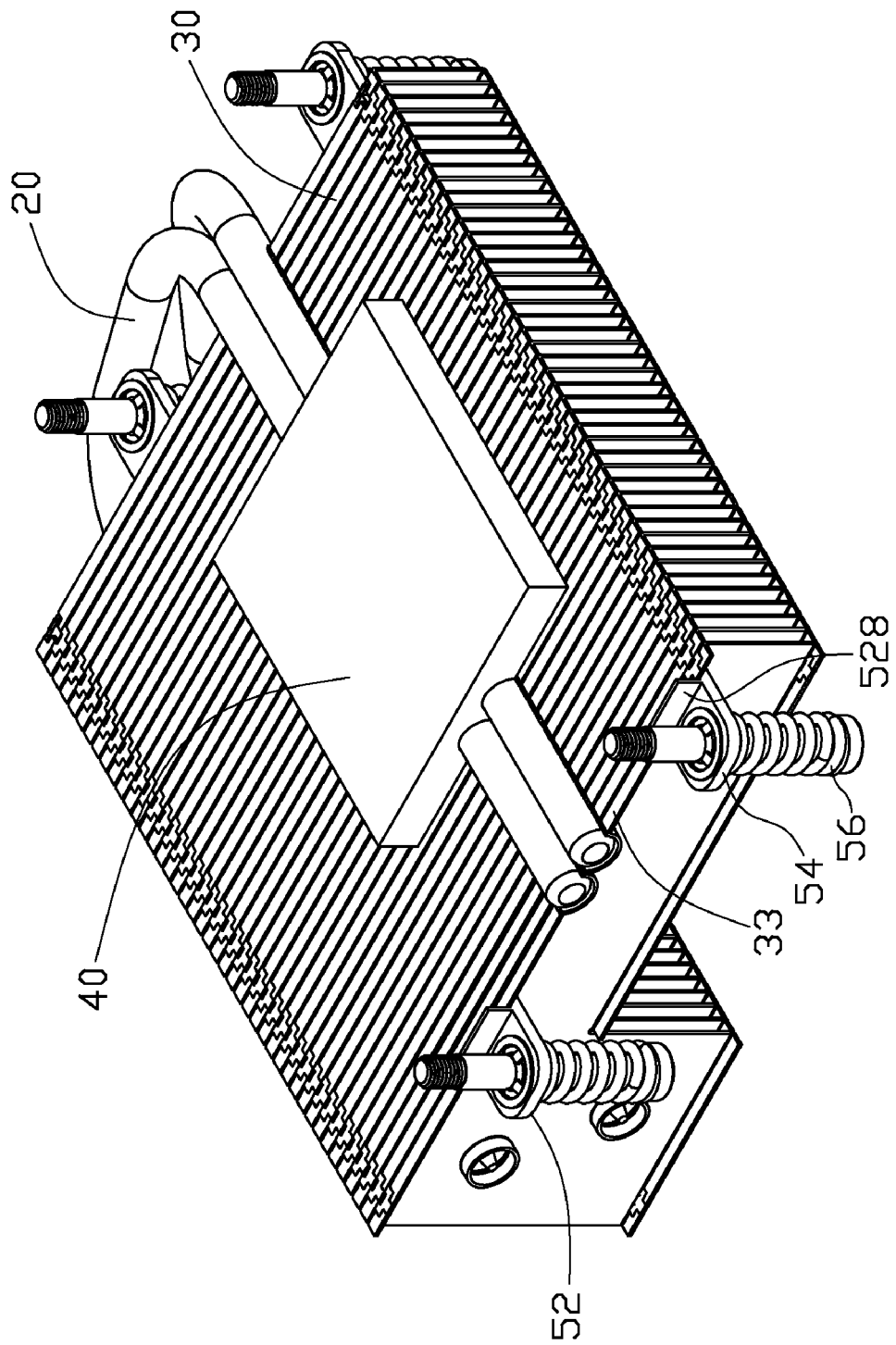
FIG. 4 is an inverted view of the heat dissipation device of FIG. 3.

Referring also to FIGS. 2-4, in assembly of the heat dissipation device, the bottom of the fins 32 are soldered to and thermally contact the top surface of the base 40 and the evaporating portions 22 of the heat pipes 20. The condensing portions 24 are soldered in the first through holes 34 of the second portion 326 of the fin set 30 and thermally contact the second portion 326. The free ends 53 of the locking beams 52 enter and pass through the second through holes 38 of the fins 32 until the protrusion 528 abuts the flange 33 of the outermost fin 32. The fasteners 56 engage the mounting holes 522 of the position ends 54 and the free ends 53 of the locking beams 52. In use, the heat sink assembly 10 is attached to the CPU 92 with the bottom surface of the base 40 mounting on the upper surface thereof. The locking beams 52 can be adjusted in the second through holes 38 to permit fasteners 56 to extend through holes 95 defined in the printed circuit board 90 and engage the retainers. Thus, the heat sink assembly 10 is secured on the printed circuit board 90.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A heat dissipation device for removing heat from a heat generating electronic device on a printed circuit board, the heat dissipation device comprising:

a base for contacting the heat generating electronic device;

a plurality of fins attached to the base, each of the fins defining a closed through hole therein, the closed through holes of the fins cooperatively defining a channel; and a clip comprising a locking beam extending through the channel of the plurality of fins and two fasteners engaging the locking beam for mounting the base and the fins onto the heat generating electronic device;

wherein the locking beam comprises a position end and a free end opposite thereto, a protrusion extending downward from the position end and abutting an outermost fin of the plurality of fins facing the position end, the protrusion located between the outermost fin and a mounting hole defined in the position end of the locking beam.

2. The heat dissipation device as described in claim 1, wherein the closed through holes of the fins are adjacent to a bottom surface of the fins.

3. The heat dissipation device as described in claim 1, wherein the closed through hole of each of the fins has rectangular configuration.

4. The heat dissipation device as described in claim 1, wherein the plurality of fins are oriented perpendicular to the base.

5. The heat dissipation device as described in claim 1, wherein the plurality of fins are parallel.

6. The heat dissipation device as described in claim 2, wherein the plurality of fins are connected.

7. The heat dissipation device as described in claim 1, wherein the clip comprises another locking beam extending through the fins and parallel to the locking beam.

8. The heat dissipation device as described in claim 1, wherein each of the plurality of fins has an L-shaped configuration.

\* \* \* \* \*